US012770837B2

(12) United States Patent
Inoue et al.

(10) Patent No.: US 12,770,837 B2
(45) Date of Patent: Oct. 20, 2026

(54) FOCUS RING PLACEMENT TABLE

(71) Applicant: NGK Insulators, Ltd., Nagoya-City (JP)

(72) Inventors: Seiya Inoue, Handa-City (JP); Tatsuya Kuno, Nagoya-City (JP)

(73) Assignee: NGK INSULATORS, LTD., Nagoya-City (JP)

( * ) Notice: Subject to any disclaimer, the term of this patent is extended or adjusted under 35 U.S.C. 154(b) by 1210 days.

(21) Appl. No.: 17/661,293

(22) Filed: Apr. 29, 2022

(65) Prior Publication Data

US 2022/0399190 A1 Dec. 15, 2022

(30) Foreign Application Priority Data

Jun. 10, 2021 (JP) ................................ 2021-097248

(51) Int. Cl.
*H01J 37/32* (2006.01)
*H05B 3/26* (2006.01)
*H10P 72/76* (2026.01)

(52) U.S. Cl.
CPC .. *H01J 37/32642* (2013.01); *H01J 37/32724* (2013.01); *H05B 3/265* (2013.01);
(Continued)

(58) Field of Classification Search
CPC ......... H01L 21/67103; H01L 21/68735; H01L 21/68721; H01L 21/563;
(Continued)

(56) References Cited

U.S. PATENT DOCUMENTS 7,071,551 B2 * 7/2006 Hiramatsu ........ H01L 21/67103 257/710
2002/0003137 A1 * 1/2002 Yokoyama ............... H05B 1/00 219/536

(Continued)

FOREIGN PATENT DOCUMENTS

CN 109962031 A 7/2019
JP 2007-194616 A 8/2007

(Continued)

OTHER PUBLICATIONS

Chinese Office Action dated Aug. 28, 2024 (Application No. 202210501337.5).

(Continued)

*Primary Examiner* — Ibrahime A Abraham
(74) *Attorney, Agent, or Firm* — Muncy, Geissler, Olds & Lowe, P.C.

(57) ABSTRACT

A focus ring placement table includes an annular ceramic heater on which a focus ring is placed, a metal base, an adhesive element bonding the metal base and the ceramic heater, an inner-peripheral-side protective element disposed between the metal base and the ceramic heater and bonded to an inner peripheral portion of the adhesive element, and an outer-peripheral-side protective element disposed between the metal base and the ceramic heater and bonded to an outer peripheral portion of the adhesive element. A coefficient of thermal expansion of the adhesive element is equal to or smaller than a coefficient of thermal expansion of the inner-peripheral-side protective element and is equal to or greater than a coefficient of thermal expansion of the outer-peripheral-side protective element.

5 Claims, 3 Drawing Sheets

(52) U.S. Cl.
CPC .... *H10P 72/7606* (2026.01); *H01J 2237/002* (2013.01); *H01J 2237/0203* (2013.01); *H01J 2237/2007* (2013.01); *H01J 2237/3321* (2013.01); *H01J 2237/334* (2013.01)

(58) Field of Classification Search
CPC . H01L 2924/01079; H01L 2224/73203; H01L 2924/01046; H01L 2924/01078; H01L 21/68757; H05B 3/265; H05B 3/283; H01J 37/32724; H01J 37/32642; H01J 2237/002; H01J 2237/3321; H01J 2237/2007; H01J 2237/334; H01J 2237/0203; H01J 37/32495; C23C 16/4586
USPC .......... 219/250–254, 460.1–464.1, 520–553; 118/728–732; 159/89.11–89.28, 159/345.51–345.55, 499; 257/753–757, 257/782, 783, 21.503, 23.127, 23.16, 257/21.584
See application file for complete search history.

(56) References Cited

U.S. PATENT DOCUMENTS

2002/0029745 A1* 3/2002 Nagaiwa ........... H01L 21/67103 118/728
2003/0102299 A1* 6/2003 Ito .......................... H05B 3/143 219/444.1
2005/0252903 A1* 11/2005 Maki ................. H01L 21/67103 219/270
2007/0144442 A1* 6/2007 Migita ............. H01L 21/68757 118/728
2007/0221363 A1* 9/2007 Akaike ............. H01L 21/67103 165/80.1
2008/0017632 A1* 1/2008 Maki ...................... H05B 3/143 338/311
2008/0142501 A1* 6/2008 Morioka .................. H05B 3/12 219/444.1
2012/0281334 A1* 11/2012 Sasaki ..................... H10P 72/72 361/234
2013/0183503 A1* 7/2013 Hayashi ................ C04B 37/008 428/701
2020/0243372 A1* 7/2020 Aoto ................. H01L 21/67098
2022/0399190 A1* 12/2022 Inoue ................ H01L 21/67103
2022/0400539 A1* 12/2022 Inoue ................ H01L 21/68735

FOREIGN PATENT DOCUMENTS

JP 2016-207979 A 12/2016
JP 2017-224710 A 12/2017
JP 2020-119997 A 8/2020

OTHER PUBLICATIONS

Japanese Office Action (Application No. 2021-097248) dated Jan. 9, 2024 (with English translation) (9 pages).

* cited by examiner

FOCUS RING PLACEMENT TABLE

BACKGROUND OF THE INVENTION

1. Field of the Invention

The present invention relates to a focus ring placement table.

2. Description of the Related Art

A wafer processing apparatus is used to perform, for example, CVD or etching on a wafer by utilizing plasma. Patent Literature 1 discloses a wafer processing apparatus including a metal base constituted by a disk-shaped center-side metal base and an annular outer-peripheral-side metal base coupled to each other, a disk-shaped center-side electrostatic chuck heater disposed on an upper surface of the center-side metal base, and an annular outer-peripheral-side electrostatic chuck heater disposed on an upper surface of the outer-peripheral-side metal base. In the disclosed wafer processing apparatus, a disk-shaped wafer is electrostatically attracted to an upper surface of the center-side electrostatic chuck heater, and an annular focus ring is electrostatically attracted to an upper surface of the outer-peripheral-side electrostatic chuck heater. Furthermore, temperature of the wafer and temperature of the focus ring are individually controlled.

CITATION LIST

Patent Literature

PTL 1: JP2016-207979

SUMMARY OF THE INVENTION

The outer-peripheral-side metal base and the outer-peripheral-side electrostatic chuck heater are bonded to each other by using an adhesive sheet. The adhesive sheet may corrode in use environment. It is, therefore, conceived to prevent corrosion of the adhesive sheet by filling a protective element to extend along peripheries (an inner peripheral portion and an outer peripheral portion) of the adhesive sheet. Such a technique is not yet known to the public until now as far as the inventors recognize. However, when the protective element is filled to extend along the peripheries of the adhesive sheet, the adhesive sheet and the protective element are closely bonded into an integral form. When the outer-peripheral-side electrostatic chuck heater comes to high temperature in the above-mentioned state, the adhesive sheet and the protective element are caused to stretch in a radially outward direction. Here, in the case of the adhesive sheet having a greater CTE (coefficient of thermal expansion) than the protective element, a stretch amount of the adhesive sheet is greater than that of the protective element, and hence the protective element is pulled by the adhesive sheet at the inner peripheral portion of the adhesive sheet. As a result, peeling or cracking may occur in at least one of the adhesive sheet and the protective element in some cases. On the other hand, in the case of the adhesive sheet having a smaller CTE than the protective element, a stretch amount of the protective element is greater than that of the adhesive sheet, and hence the adhesive sheet is pulled by the protective element at the outer peripheral portion of the adhesive sheet. As a result, peeling or cracking may occur in at least one of the adhesive sheet and the protective element in some cases. The above-described problem arises regardless of an electrostatic attraction function.

The present invention has been made to solve the above-described problem, and a main object of the present invention is to protect, by protective elements, an inner peripheral side and an outer peripheral side of an adhesive element bonding a ceramic heater for a focus ring and a metal base, while preventing the occurrence of trouble attributable to the differences in thermal expansion between the adhesive element and the protective elements.

The present invention provides a focus ring placement table including: an annular ceramic heater on which a focus ring is placed; a metal base; an adhesive element bonding the metal base and the ceramic heater; an inner-peripheral-side protective element disposed between the metal base and the ceramic heater and bonded to an inner peripheral portion of the adhesive element; and an outer-peripheral-side protective element disposed between the metal base and the ceramic heater and bonded to an outer peripheral portion of the adhesive element, wherein a coefficient of thermal expansion of the adhesive element is equal to or smaller than a coefficient of thermal expansion of the inner-peripheral-side protective element and is equal to or greater than a coefficient of thermal expansion of the outer-peripheral-side protective element.

The above-described focus ring placement table includes the inner- and outer-peripheral-side protective elements disposed to extend along the inner- and outer-peripheral-side portions of the adhesive element. Inner and outer peripheral sides of the adhesive element are protected by the protective elements. When the above-described focus ring placement table comes to high temperature, the adhesive element and the inner- and outer-peripheral-side protective elements are caused to stretch in a radially outward direction. At that time, because the coefficient of thermal expansion of the adhesive element is equal to or smaller than that of the inner-peripheral-side protective element, an amount by which the adhesive element stretches in the radially outward direction is equal to or smaller than an amount by which the inner-peripheral-side protective element stretches in the radially outward direction. Hence the adhesive element does not cause tensile stress acting to pull the inner-peripheral-side protective element in the radially outward direction. Accordingly, trouble attributable to the difference in thermal expansion can be prevented from occurring in at least one of the adhesive element and the inner-peripheral-side protective element. Furthermore, because the coefficient of thermal expansion of the adhesive element is equal to or greater than that of the outer-peripheral-side protective element, an amount by which the outer-peripheral-side protective element stretches in the radially outward direction is equal to or smaller than the amount by which the adhesive element stretches in the radially outward direction. Hence the outer-peripheral-side protective element does not cause tensile stress acting to pull the adhesive element in the radially outward direction. Accordingly, trouble attributable to the difference in thermal expansion can be prevented from occurring in at least one of the adhesive element and the outer-peripheral-side protective element.

In the focus ring placement table according to the present invention, the coefficient of thermal expansion of the adhesive element may be smaller than the coefficient of thermal expansion of the inner-peripheral-side protective element and may be greater than the coefficient of thermal expansion of the outer-peripheral-side protective element. With this feature, the coefficients of thermal expansion of the adhesive element, the inner-peripheral-side protective element, and the outer-peripheral-side protective element do not need to be set to the same value.

In the focus ring placement table according to the present invention, the metal base may include an insulating film on a lateral surface of the metal base and on at least each of regions of a surface of the metal base where the inner-peripheral-side protective element and the outer-peripheral-side protective element are formed, the surface facing the ceramic heater. This feature can prevent unexpected discharge from occurring through the metal base. The insulating film preferably has corrosion resistance under use environment. The insulating film can be formed of, for example, a ceramic sprayed film. The insulating film may be formed to extend over a region of the surface of the metal base where the adhesive element is formed, the surface facing the ceramic heater.

In the focus ring placement table according to the present invention, materials of different categories may be used, by way of example, in adjusting the coefficients of thermal expansion of the adhesive element, the inner-peripheral-side protective element, and the outer-peripheral-side protective element. The categories of the materials may be, for example, epoxy resin, acrylic resin, and silicone resin. Alternatively, resins belonging to the same category but having different compositions may be used. For example, the category of epoxy resin includes many kinds of epoxy resins with different compositions, and some of those epoxy resins exhibit different coefficients of thermal expansion because of having the different compositions. The above point is similarly applied to the other resins. As an alternative, resins having the same composition but being different in type and amount of an additive may be used. An example of the additive may be a filler. For example, when a filler proving a smaller coefficient of thermal expansion (CTE) with addition in a greater amount is added to silicone resins with the same composition, relation of (CTE of the inner-peripheral-side protective element)>(CTE of the adhesive sheet)>(CTE of the outer-peripheral-side protective element) can be obtained by setting the added amount of the filler to be minimum for the inner-peripheral-side protective element and to be maximum for the outer-peripheral-side protective element.

DETAILED DESCRIPTION OF THE INVENTION

Figure 1:
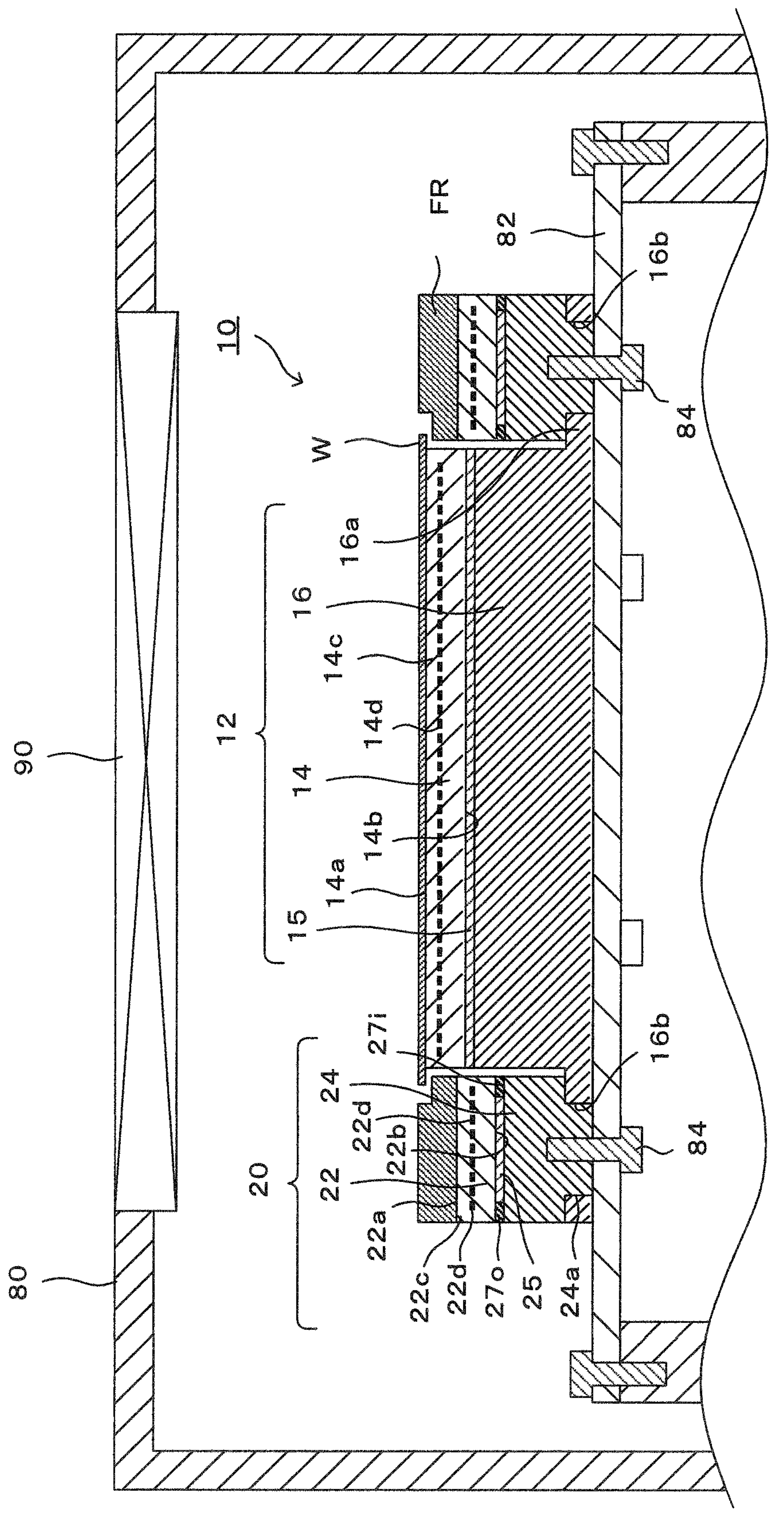
FIG. 1 is a vertical sectional view of a wafer processing apparatus 10.
Figure 2:
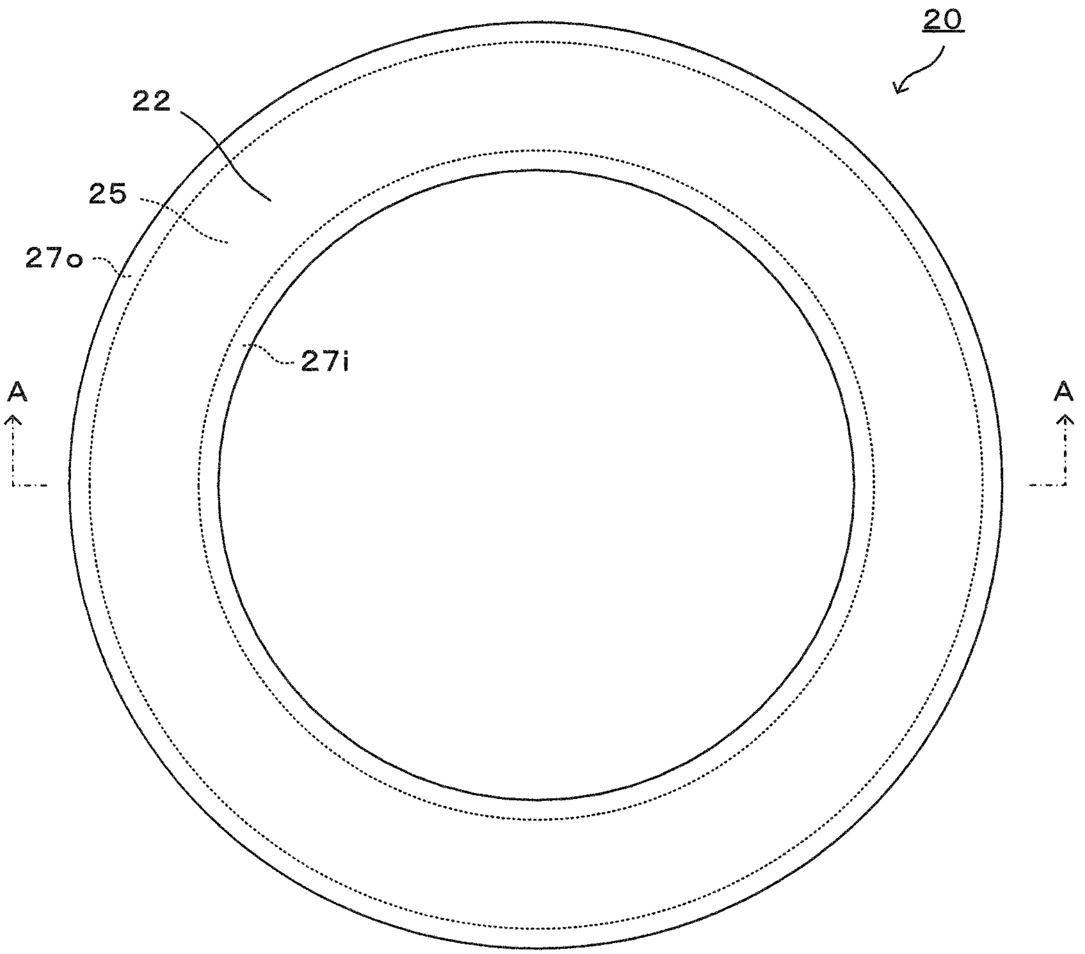
FIG. 2 is a plan view of a focus ring placement table 20.
Figure 3:
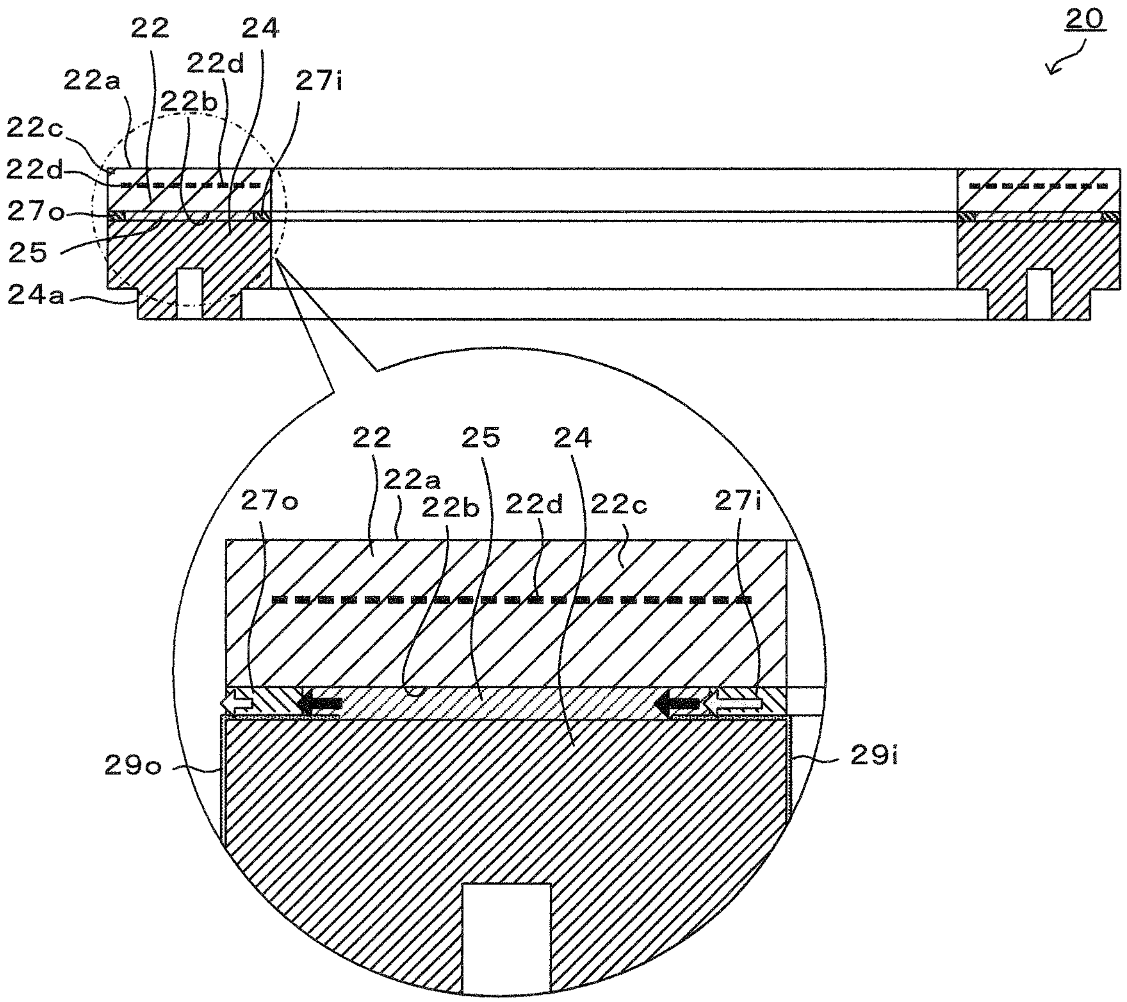
FIG. 3 is a vertical sectional view taken along A-A in FIG. 2.

A preferred embodiment of the present invention will be described below with reference to the drawings. FIG. 1 is a vertical sectional view of a wafer processing apparatus 10, FIG. 2 is a plan view of a focus ring placement table 20, and FIG. 3 is a vertical sectional view taken along A-A in FIG. 2 (including an enlarged partial view). Although the following description is made using words "upper, lower, left, right, front, and rear", for example, in some cases, those words "upper, lower, left, right, front, and rear" merely indicate relative positional relations.

The wafer processing apparatus 10 is used to perform, for example, CVD or etching on a wafer W by utilizing plasma and is fixed to a mounting plate 82 that is disposed inside a chamber 80 for a semiconductor process. The wafer processing apparatus 10 includes a wafer placement table 12 and a focus ring placement table 20. Hereinafter, the focus ring is abbreviated to "FR" in some cases.

The wafer placement table 12 includes a wafer-heating ceramic heater 14 and a wafer cooling plate 16. The wafer cooling plate 16 is bonded to a rear surface **14*b* of the wafer-heating ceramic heater 14 on an opposite side to a front surface 14*a* thereof, the front surface 14*a* serving as a wafer placement surface, with an adhesive sheet 15 interposed between the wafer cooling plate 16 and the wafer-heating ceramic heater 14. The adhesive sheet 15 is a circular both-sided adhesive tape. For example, epoxy resin, acrylic resin, or silicone resin may be used as a material of the adhesive sheet 15**.

The wafer-heating ceramic heater 14 is a disk-shaped member and is formed by embedding a resistance heating element **14*d* in a ceramic base 14*c*. The ceramic base 14*c* is a disk-shaped plate made of a ceramic material represented by, for example, alumina, aluminum nitride, or yttria. The wafer W is placed on the front surface 14*a* of the ceramic base 14*c*. The resistance heating element 14*d* is formed of a conductive coil or printed pattern and is wired over the entire front surface in a one-stroke pattern from one end to the other end without including intersections when viewed in plan. The one end and the other end of the resistance heating element 14*d* are connected to a pair of power feed rods (not illustrated), the power feed rods penetrating through the mounting plate 82, the wafer cooling plate 16, and the adhesive sheet 15 and being inserted into the ceramic base 14*c*. A voltage is applied to the resistance heating element 14*d*** through the power feed rods.

The wafer cooling plate 16 is a disk-shaped plate made of metal represented by, for example, aluminum or an aluminum alloy and includes therein a coolant path (not illustrated) through which a coolant can be circulated. The coolant path is connected to a coolant supply path and a coolant discharge path (not illustrated) each penetrating through the mounting plate 82. A coolant discharged from the coolant discharge path is returned to the coolant supply path again after being subjected to temperature adjustment. The wafer cooling plate 16 includes a wafer-cooling-plate flange portion **16*a* protruding radially outward from an outer peripheral surface of a lower end portion of the wafer cooling plate 16 (namely, an end portion thereof on a side closer the mounting plate 82). A plurality of through-holes 16*b* are formed in the wafer-cooling-plate flange portion 16*a*** along a circumferential direction.

The FR placement table 20 is separate from the wafer placement table 12 and is disposed around an outer periphery of the wafer placement table 12. The FR placement table 20 includes an FR heating ceramic heater 22 and an FR cooling plate 24. The FR cooling plate 24 is bonded to a rear surface **22*b* of the FR heating ceramic heater 22 on an opposite side to a front surface 22*a* thereof, the front surface 22*a* serving as an FR placement surface, with an adhesive sheet 25 interposed between the FR cooling plate 24 and the FR heating ceramic heater 22. The adhesive sheet 25 is an annular both-sided adhesive tape. For example, epoxy resin, acrylic resin, or silicone resin may be used as a material of the adhesive sheet 25**.

The FR heating ceramic heater 22 is formed by embedding a resistance heating element **22*d* in a ceramic base 22*c*. The ceramic base 22*c* is a ring-shaped plate made of a similar material to that of the ceramic base 14*c*. A focus ring FR is placed on the front surface 22*a*** of the ceramic base 22*c*. The resistance heating element 22*d* is formed of a conductive coil or printed pattern and is wired over the entire front surface in a one-stroke pattern from one end to the other end without including intersections when viewed in plan. The one end and the other end of the resistance heating element 22*d* are connected to a pair of power feed rods (not illustrated), the power feed rods penetrating through the mounting plate 82, the FR cooling plate 24, and the adhesive sheet 25 and being inserted into the ceramic base 22*c*. A voltage is applied to the resistance heating element 22*d* through the power feed rods.

The FR cooling plate 24 is a ring-shaped plate made of metal represented by, for example, aluminum or an aluminum alloy and includes therein a coolant path (not illustrated) through which a coolant can be circulated. The coolant path is connected to a coolant supply path and a coolant discharge path each penetrating through the mounting plate 82. A coolant discharged from the coolant discharge path is returned to the coolant supply path again after being subjected to temperature adjustment. The FR cooling plate 24 includes a plurality of protruding portions 24*a* provided at a rear surface of the FR cooling plate 24 along a circumferential direction. The wafer placement table 12 is fixed to the mounting plate 82 with the FR placement table 20 interposed therebetween by fastening bolts 84 into threaded holes of the protruding portions 24*a* from a rear surface side of the mounting plate 82 in such a state that the protruding portions 24*a* provided at the rear surface of the FR cooling plate 24 are fitted to the through-holes 16*b* of the wafer-cooling-plate flange portion 16*a*.

In a region between the FR heating ceramic heater 22 and the FR cooling plate 24, on an inner peripheral side of the adhesive sheet 25, an adhesive inner-peripheral-side protective element 27*i* is disposed to extend along an inner peripheral portion (inner peripheral surface) of the adhesive sheet 25. The adhesive sheet 25 and the inner-peripheral-side protective element 27*i* are bonded to each other. In the region between the FR heating ceramic heater 22 and the FR cooling plate 24, on an outer peripheral side of the adhesive sheet 25, an adhesive outer-peripheral-side protective element 27*o* is disposed to surround an outer peripheral portion (outer peripheral surface) of the adhesive sheet 25. The adhesive sheet 25 and the outer-peripheral-side protective element 27*o* are bonded to each other. A coefficient of thermal expansion (CTE) of the adhesive sheet 25 is equal to or smaller than that of the inner-peripheral-side protective element 27*i* and is preferably smaller than that of the inner-peripheral-side protective element 27*i*. The CTE of the adhesive sheet 25 is equal to or greater than that of the outer-peripheral-side protective element 27*o* and is preferably greater than that of the outer-peripheral-side protective element 27*o*. The inner-peripheral-side protective element 27*i* and the outer-peripheral-side protective element 27*o* are each made of a material with higher corrosion resistance than the adhesive sheet 25 in an environmental atmosphere (for example, an atmosphere of process gas or plasma) under which the wafer processing apparatus 10 is used. Accordingly, the inner-peripheral-side protective element 27*i* and the outer-peripheral-side protective element 27*o* serve to protect the adhesive sheet 25 from the atmosphere of use environment. For example, when epoxy resin is used as the material of the adhesive sheet 25, silicone resin can be used as materials of the inner-peripheral-side protective element 27*i* and the outer-peripheral-side protective element 27*o*. In such a case, the CTE of the inner-peripheral-side protective element 27*i* and the CTE of the outer-peripheral-side protective element 27*o* may be set to different values by using silicone resin with the same composition and adjusting the types and/or amounts of fillers added to the silicone resin, or by using silicone resins with different compositions. For example, alumina or yttria may be used as the filler.

The FR cooling plate 24 includes an inner-peripheral-side insulating film 29*i* and an outer-peripheral-side insulating film 29*o*. The inner-peripheral-side insulating film 29*i* is disposed on an inner peripheral surface of the FR cooling plate 24 and a region of a surface of the FR cooling plate 24 on a side facing the FR heating ceramic heater 22 where the inner-peripheral-side protective element 27*i* is formed. In this embodiment, the inner-peripheral-side insulating film 29*i* extends up to an inner position of the adhesive sheet 25. The outer-peripheral-side insulating film 29*o* is disposed on an outer peripheral surface of the FR cooling plate 24 and a region of the surface of the FR cooling plate 24 on the side facing the FR heating ceramic heater 22 where the outer-peripheral-side protective element 27*o* is formed. In this embodiment, the outer-peripheral-side insulating film 29*o* extends up to an inner position of the adhesive sheet 25. The insulating films 29*i* and 29*o* preferably have corrosion resistance under the use environment. The insulating films 29*i* and 29*o* can be each formed of, for example, a sprayed film. An insulating ceramic (for example, alumina or yttria) may be used as a material of the sprayed film.

The FR placement table 20 can be manufactured by, for example, the following method. First, the FR heating ceramic heater 22, the FR cooling plate 24, and a both-sided tape are prepared. The both-sided tape finally becomes the adhesive sheet 25 and includes release paper sheets on both surfaces. Then, one release paper sheet is released from one surface of the both-sided tape to make an adhesive surface exposed, and the exposed adhesive surface of the both-sided tape is bonded to a front surface of the FR cooling plate 24. Then, the other release paper sheet is released from the other surface of the both-sided tape to make an adhesive surface exposed, and the rear surface 22*b* of the FR heating ceramic heater 22 is placed on and bonded to the exposed adhesive surface. This provides a state in which the FR heating ceramic heater 22 and the FR cooling plate 24 are bonded to each other by the adhesive sheet 25. Thereafter, an adhesive filling material is filled to regions along peripheries (on an inner peripheral side and an outer peripheral side) of the adhesive sheet 25 between the FR heating ceramic heater 22 and the FR cooling plate 24. The filling material finally becomes the inner- and outer-peripheral-side protective elements 27*i* and 27*o*. On that occasion, the filling material is filled such that the filling material and the adhesive sheet 25 closely contact each other. Then, the filling material is solidified to form the inner- and outer-peripheral-side protective elements 27*i* and 27*o*. As a result, the FR placement table 20 is obtained.

An example of use of the wafer processing apparatus 10 will be described below with reference to FIG. 1. The chamber 80 includes therein the mounting plate 82 on which the wafer processing apparatus 10 is to be mounted. As described above, the wafer processing apparatus 10 is mounted on the mounting plate 82. A shower head 90 for discharging the process gas into the inside of the chamber 80 from many gas injection holes is disposed at a ceiling surface of the chamber 80.

The disk-shaped wafer W is placed on the front surface 14*a* of the wafer processing apparatus 10. Temperature of the wafer W can be controlled by adjusting both electric power supplied to the resistance heating element 14*d* of the wafer ceramic heater 14 and temperature of the coolant supplied to the coolant path (not illustrated) in the wafer cooling plate 16. Temperature control of the wafer W is performed by detecting the temperature of the wafer W with a temperature detection sensor (not illustrated) and executing feedback control such that the detected temperature is kept at a target temperature.

The focus ring (FR) is placed on the front surface 22*a* of the wafer processing apparatus 10. To avoid interference with the wafer W, the focus ring includes a step formed to be recessed along an inner periphery of an upper end portion. Temperature of the focus ring can be controlled by adjusting both electric power supplied to the resistance heating element 22*d* of the FR heating ceramic heater 22 and temperature of the coolant supplied to the coolant path (not illustrated) in the FR cooling plate 24. Temperature control of the focus ring is performed by detecting the temperature of the focus ring with a temperature detection sensor (not illustrated) and executing feedback control such that the detected temperature is kept at a target temperature.

In the above-mentioned state, the inside of the chamber 80 is set to be held in a predetermined vacuum atmosphere (or a reduced-pressure atmosphere), and plasma is generated by supplying high-frequency electric power between the wafer cooling plate 16 of the wafer placement table 12 and the shower head 90 while the process gas is supplied from the shower head 90. Then, CVD film deposition or etching is performed on the wafer by utilizing the produced plasma. A space below the mounting plate 82 is held in an atmosphere.

With the progress of plasma processing on the wafer W, the focus ring also wears. However, because the focus ring is thick, replacement of the focus ring is made after processing a plurality of wafers W.

Here, behaviors of the adhesive sheet 25 and the inner- and outer-peripheral-side protective elements 27*i* and 27*o* in the FR placement table 20 are described with reference to an enlarged partial view of FIG. 3. When the FR placement table 20 comes to high temperature, the adhesive sheet 25 and the inner- and outer-peripheral-side protective elements 27*i* and 27*o* are caused to stretch in a radially outward direction (direction denoted by arrows in the enlarged partial view of FIG. 3). At that time, because the CTE of the adhesive sheet 25 is equal to or smaller than that of the inner-peripheral-side protective element 27*i*, a stretch amount (denoted by a black arrow in FIG. 3) of the adhesive sheet 25 in the radially outward direction is equal to or smaller than a stretch amount (denoted by a gray arrow in FIG. 3) of the inner-peripheral-side protective element 27*i* in the radially outward direction. Hence the adhesive sheet 25 does not cause tensile stress acting to pull the inner-peripheral-side protective element 27*i* in the radially outward direction. Accordingly, trouble (for example, peeling or cracking) attributable to the difference in thermal expansion can be prevented from occurring in at least one of the adhesive sheet 25 and the inner-peripheral-side protective element 27*i*. Furthermore, because the CTE of the adhesive sheet 25 is equal to or greater than that of the outer-peripheral-side protective element 27*o*, a stretch amount (denoted by a white arrow in FIG. 3) of the outer-peripheral-side protective element 27*o* in the radially outward direction is equal to or smaller than the stretch amount (denoted by the black arrow in FIG. 3) of the adhesive sheet 25 in the radially outward direction. Hence the outer-peripheral-side protective element 27*o* does not cause tensile stress acting to pull the adhesive sheet 25 in the radially outward direction. Accordingly, the trouble attributable to the difference in thermal expansion can be prevented from occurring in at least one of the adhesive sheet 25 and the outer-peripheral-side protective element 27*o*.

The correspondence between components in this embodiment and components in the present invention is now explained. The FR placement table 20 in this embodiment corresponds to a focus ring placement table in the present invention. The FR heating ceramic heater 22 corresponds to a ceramic heater. The FR cooling plate 24 corresponds to a metal base. The adhesive sheet 25 corresponds to an adhesive element. The inner- and outer-peripheral-side protective elements 27*i* and 27*o* correspond to inner- and outer-peripheral-side protective elements, respectively.

According to the FR placement table 20 described above, since the adhesive sheet 25 is protected by the inner- and outer-peripheral-side protective elements 27*i* and 27*o*, the corrosion resistance of the adhesive sheet 25 in the use environment of the FR placement table 20 is increased. Furthermore, since the CTE of the adhesive sheet 25 is set to be equal to or smaller than that of the inner-peripheral-side protective element 27*i* and equal to or greater than that of the outer-peripheral-side protective element 27*o*, the trouble attributable to the difference in thermal expansion can be prevented from occurring in any of the adhesive sheet 25, the inner-peripheral-side protective element 27*i*, and the outer-peripheral-side protective element 27*o*.

In addition, since the FR cooling plate 24 includes the inner-peripheral-side insulating films 29*i* and outer-peripheral-side insulating films 29*o* on lateral surfaces of the FR cooling plate 24 and on the regions of the surface of the FR cooling plate 24 facing the FR heating ceramic heater 22 where the inner- and outer-peripheral-side protective elements 27*i* and 27*o* are formed, unexpected discharge can be prevented from occurring through the FR cooling plate 24.

It is a matter of course that the present invention is not limited to the above-described embodiment and can be implemented in various forms insofar as falling within the technical scope of the present invention.

For example, when the adhesive sheet 25 and the inner-peripheral-side protective element 27*i* are formed using different materials, or the adhesive sheet 25 and the outer-peripheral-side protective element 27*o* are formed using different material in the above-described embodiment, it is not easy to set the CTEs of those components to the same value in some cases. For that reason, the CTE of the adhesive sheet 25 may be set to be smaller than that of the inner-peripheral-side protective element 27*i* and greater than that of the outer-peripheral-side protective element 27*o*.

In the above-described embodiment, an electrostatic electrode may be disposed in the wafer-heating ceramic heater 14 between the front surface 14*a* and the resistance heating element 14*d*, and the wafer W may be attracted to the front surface 14*a* by applying a direct-current voltage to the electrostatic electrode. An electrostatic electrode may be disposed in the FR heating ceramic heater 22 between the front surface 22*a* and the resistance heating element 22*d*, and the focus ring may be attracted to the front surface 22*a* by applying a direct-current voltage to the electrostatic electrode.

Although, in the above-described embodiment, the wafer cooling plate 16 and the FR cooling plate 24 are separate members, the wafer cooling plate 16 and the FR cooling plate 24 may be integrated into one member.

In the above-described embodiment, for example, epoxy resin may be used as all materials of the adhesive sheet 25, the inner-peripheral-side protective element 27*i*, and the outer-peripheral-side protective element 27*o*. In such a case, epoxy resin with the CTE of $3\times10^{-5}$ [/° C.] may be used as the inner-peripheral-side protective element 27*i*, an epoxy resin sheet with the CTE of $1\times10^{-5}$ [/° C.] may be used as the adhesive sheet 25, and epoxy resin with the CTE of $6\times10^{-6}$ [/° C.] may be used as the outer-peripheral-side protective element 27_o_.

Although, in the above-described embodiment, the adhesive sheet 25 is used, by way of example, as the adhesive element, another suitable element obtained by solidifying flowable resin may be used instead of the adhesive sheet 25.

The present application claims priority from Japanese Patent Application No. 2021-097248, filed on Jun. 10, 2021, the entire contents of which are incorporated herein by reference.

What is claimed is:

1. A focus ring placement table comprising:

an annular ceramic heater on which a focus ring is placed;

a metal base;

an adhesive element bonding the metal base and the ceramic heater;

an inner-peripheral-side protective element disposed between the metal base and the ceramic heater and bonded to an inner peripheral portion of the adhesive element; and an outer-peripheral-side protective element disposed between the metal base and the ceramic heater and bonded to an outer peripheral portion of the adhesive element, wherein a coefficient of thermal expansion of the adhesive element is smaller than a coefficient of thermal expansion of the inner-peripheral-side protective element and is greater than a coefficient of thermal expansion of the outer-peripheral-side protective element, and wherein the adhesive element, the inner-peripheral-side protective element, and the outer-peripheral-side protective element each comprise a respective epoxy resin, acrylic resin or silicone resin and each are respectively of differing compositions.

2. The focus ring placement table according to claim 1, wherein the metal base includes an insulating film on a lateral surface of the metal base and on at least each of regions of a surface of the metal base where the inner-peripheral-side protective element and the outer-peripheral-side protective element are formed, the surface facing the ceramic heater.

3. The focus ring placement table according to claim 1, wherein the adhesive element, the inner-peripheral-side protective element, and the outer-peripheral-side protective element each comprise a respective acrylic resin or silicone resin and each are respectively of differing compositions.

4. The focus ring placement table according to claim 1, wherein the adhesive element, the inner-peripheral-side protective element, the outer-peripheral-side protective element each comprising a respective epoxy resin, acrylic resin or silicone resin further each include a filler.

5. The focus ring placement table according to claim 4, wherein the filler is alumina, yttria or combinations thereof.

* * * * *